US012620552B2

(12) United States Patent (10) Patent No.: US 12,620,552 B2
Dolník et al. (45) Date of Patent: May 5, 2026

(54) METHOD FOR MICROMACHINING A BIOLOGICAL SAMPLE FOR CREATING A LAMELLA FOR ANALYSIS IN A CRYO-CHARGED PARTICLE MICROSCOPE

(71) Applicant: FEI Company, Hillsboro, OR (US)

(72) Inventors: Matej Dolník, Brno (CZ); Veronika Vrbovská, Brno (CZ); Radim Kříž, Brno (CZ); Jakub Kuba, Brno (CZ); Tilman Franke, Planegg (DE)

(73) Assignee: FEI Company, Hillsboro, OR (US)

( * ) Notice: Subject to any disclaimer, the term of this patent is extended or adjusted under 35 U.S.C. 154(b) by 99 days.

(21) Appl. No.: 18/522,679

(22) Filed: Nov. 29, 2023

(65) Prior Publication Data

US 2024/0177967 A1 May 30, 2024

(30) Foreign Application Priority Data

Nov. 30, 2022 (EP) ..................................... 22210709

(51) Int. Cl.
H01J 37/305 (2006.01)

(52) U.S. Cl.
CPC . H01J 37/3056 (2013.01); H01J 2237/31749 (2013.01)

(58) Field of Classification Search
CPC ........ H01J 37/3056; H01J 2237/31749; G01N 1/32
See application file for complete search history.

(56) References Cited

U.S. PATENT DOCUMENTS

| | | | | |
|---|---|---|---|---|
| 8,754,384 B1 * | 6/2014 | Persoon | .................. | H01J 37/20 |
| | | | | 250/306 |
| 2013/0175446 A1 * | 7/2013 | Nakatani | .................. | G01N 1/28 |
| | | | | 250/310 |
| 2014/0084157 A1 * | 3/2014 | Miller | ..................... | H01J 37/20 |
| | | | | 250/306 |

(Continued)

FOREIGN PATENT DOCUMENTS

| | | |
|---|---|---|
| EP | 2852967 A1 | 4/2015 |
| WO | 2019071352 A1 | 4/2019 |

OTHER PUBLICATIONS

Buckley et al., "Automated cyro-lamella preparation for high-throughput in-situ structural biology," Journal of Structural Biology, 210, 2020 (8 pages).

(Continued)

*Primary Examiner* — Patrick S Ott
(74) *Attorney, Agent, or Firm* — Michael Best & Friedrich LLP

(57) ABSTRACT
The disclosure relates to a method for micromachining a biological sample for creating a lamella for analysis in a Cryo-Charged Particle Microscope (Cryo-CPM). The method comprising the steps of providing a biological sample on a sample carrier; Locating a sample area on the sample carrier, said sample area comprising a region of interest having biological material from which a lamella can be created; and Micromachining at least part of the biological sample so as to remove material in a part of the sample area surrounding the region of interest, in order to increase a visual contrast between the biological material in the region of interest and its surroundings. With the increased visual contrast a location for a potential lamella can be identified.

16 Claims, 8 Drawing Sheets

(56)                    References Cited

U.S. PATENT DOCUMENTS

Figure 1:
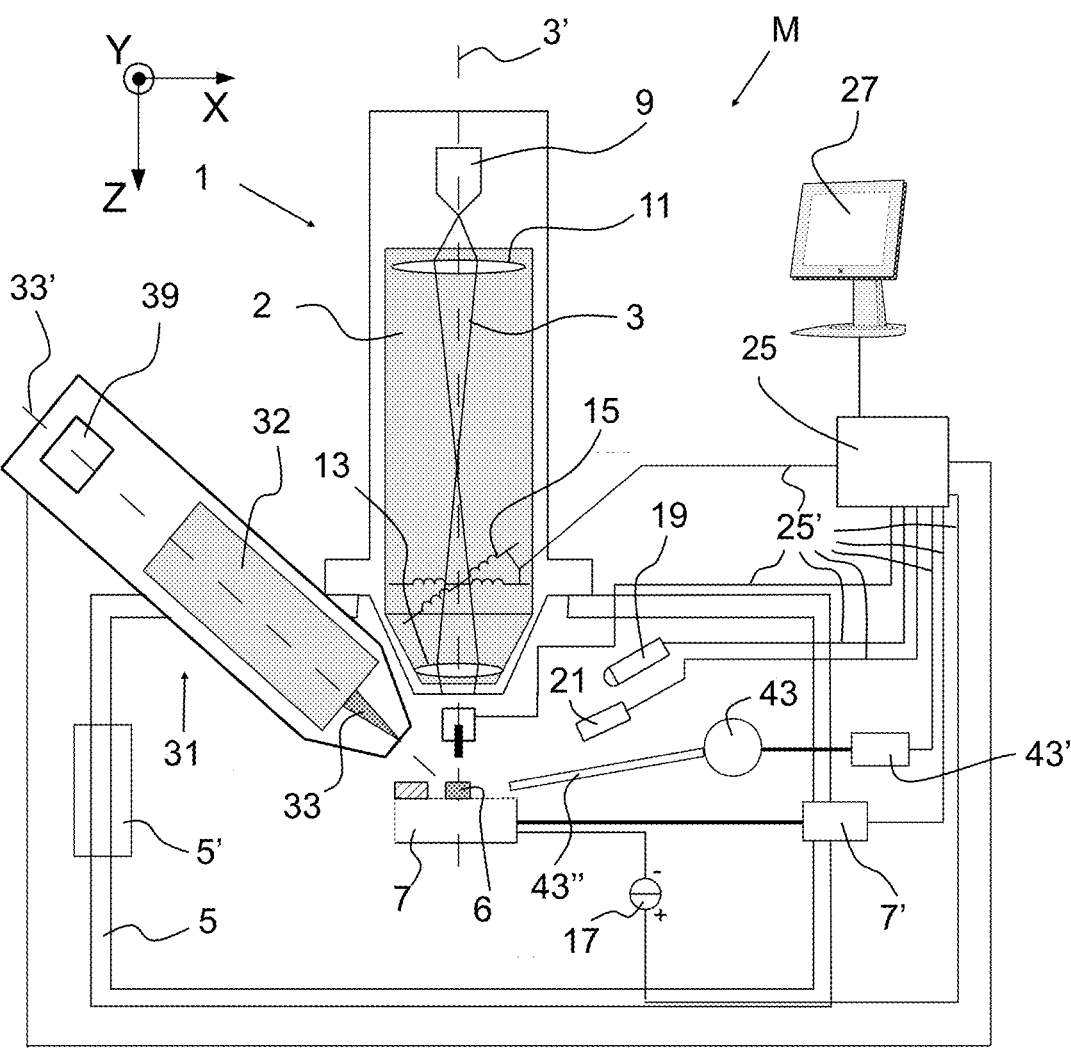

| | | | |
|---|---|---|---|
| 2015/0170874 A1* | 6/2015 | Price | H01J 37/023 |
| | | | 250/440.11 |
| 2015/0357159 A1* | 12/2015 | Stone | H01J 37/317 |
| | | | 204/298.36 |
| 2016/0126060 A1* | 5/2016 | Fuller | H01J 37/22 |
| | | | 250/492.3 |
| 2017/0025246 A1* | 1/2017 | Bouchet-Marquis | |
| | | | H01J 37/222 |
| 2024/0177967 A1* | 5/2024 | Dolník | G01N 1/32 |

OTHER PUBLICATIONS

European Patent Office Search Report for Application No. 22210709, dated May 19, 2023 (10 pages).

* cited by examiner

METHOD FOR MICROMACHINING A BIOLOGICAL SAMPLE FOR CREATING A LAMELLA FOR ANALYSIS IN A CRYO-CHARGED PARTICLE MICROSCOPE

CROSS REFERENCE TO RELATED APPLICATIONS

This application claims priority to European Application No. EP22210709.6, filed Nov. 30, 2022, the entire contents of which is herein incorporated by reference.

The invention relates to a method and system for micromachining a biological sample for creating a lamella for analysis in a Cryo-Charged Particle Microscope.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:

In a SEM, irradiation of a sample by a scanning electron beam precipitates emanation of "auxiliary" radiation from the sample, in the form of secondary electrons, backscattered electrons, X-rays and photoluminescence (infrared, visible and/or ultraviolet photons), for example; one or more components of this flux of emanating radiation is/are then detected and used for image accumulation purposes.

In a TEM, the electron beam used to irradiate the sample is chosen to be of a high-enough energy to penetrate the sample (which, to this end, will generally be thinner than in the case of an SEM sample); the flux of transmitted electrons emanating from the sample can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particles. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In what follows, the invention will—by way of example—often be set forth in the specific context of electron microscopy (EM). However, such simplification is intended solely for clarity/illustrative purposes and should not be interpreted as limiting.

Samples for electron microscope imaging require certain preparation for observation under transmitted light or electron radiation. For example, thin slices (or sections) of a sample are typically cut or milled from a bulk sample in a grid or tube. The cutting or milling can be performed by a focused ion beam (FIB) system, or within a dual beam system that includes both a FIB and an electron microscope.

Examples of such dual beam systems include the Quanta 3D DualBeam systems from FEI Corporation (Hillsboro, OR, USA). After the thin slices are prepared using the FIB, the sample must then be transferred to a platform suitable for imaging.

Sample preparation is in particular a challenge for biological samples (such as cells, cell components, single-cellular organisms, etc.). As these biological samples need to be stored and studied in a body of aqueous liquid (such as water, electrolyte, cell fluid, blood plasma, etc.), they present significant challenges vis-à-vis their examination in a charged particle microscope (CPM), since:

An aqueous liquid introduced into a (quasi-)vacuum environment of a CPM will start to outgas/boil, thus tending to degrade the sample;

To prevent this, the sample can be provided on a sample carrier, after which it can be frozen, using a cryogenic liquid, before being introduced into said vacuum. Such freezing must generally be performed very rapidly, with the aim of achieving sample vitrification (solidification into an amorphous, glass-like phase) without significant ice crystallization. After this, the sample needs to be kept at cryogenic temperatures, i.e. at or below −150° C.

Once the biological bulk sample is created, thinning using a cryo-focused ion beam (cryo-FIB) can be used to create one or more thin lamellae, that can then be studied in a TEM or SEM, for example. The thinning by cryo-FIB has proved an optimal, artifact-free preparation method.

Sample preparation for cellular cryo-ET, whether performed directly on thin cellular peripheries or following FIB micromachining, routinely involves seeding of adherent cells directly on EM grids. Standard EM grids are 3 mm diameter metal meshes overlaid with a delicate perforated thin film. Cells are typically allowed to spread, subjected to genetic or molecular perturbation to represent different physiological settings to be examined in molecular detail, that are then arrested by vitrification. Interesting parts of the cells can then be selected for lamellae creation.

Various cell lines and a high variation in sample quality make lamella preparation (for example for a cryo-tomography workflow) a complex process, and user input is required in several stages. At present, the known milling approach requires manual user input to evaluate the precise spot for lamella milling. Users are required to identify regions of interest and place patterns adequately, which requires a lot of knowledge and experience. An unskilled user may easily misevaluate the precise spot, leading to an unsuccessful workflow with an unusable lamella as a result.

With the above in mind, it is an object of the disclosure to provide a method and/or device that improves the above-mentioned drawbacks of cryo-lamella sample preparation.

To this end, the disclosure provides a method according to claim 1, and a charged particle beam system according to claim 13.

Disclosed herein is a method of micromachining a biological sample for creating a lamella for analysis in a Cryo-Charged Particle Microscope (Cryo-CPM).

The method comprises the steps of providing a biological sample on a sample carrier. Then, a sample area is located on the sample carrier. This sample area comprises a region of interest with biological material from which a lamella can be created. In other words, the sample carrier comprises biological material, such as biological cells, that are provided on top of the sample carrier. From these cells a thin slice, also referred to as lamella, can be created by removing excess biological material. The biological material comprising the lamella is referred to as region of interest. The region of interest is surrounded by sample carrier material (which may or may not contain additional biological material). As defined herein, the sample area is the material surrounding the region of interest, together with the region of interest itself.

According to the method as disclosed herein, at least part of the biological sample is micromachined so as to remove material in a part of the sample area surrounding the region of interest. With this step, a visual contrast between the biological material in the region of interest and its surroundings is increased, as the removed material contrasts nicely with the biological material remaining in the region of interest. Therefore, this micromachining step can be referred to as a contrast enhancing step. In any event, this contrast enhancing step comprises removing material surrounding the biological material from which a lamella is to be made, without actually removing (parts of) the biological material itself. Thus, in this contrast enhancing step the biological material from which the lamella can be made is substantially left intact or unharmed.

The biological material comprises a certain volume, and thus extends from the sample carrier in a direction orthogonal with respect to a plane defined by the sample carrier. This feature of the biological material can be used to identify a top part of the volume, i.e. the part of the biological material that is furthest away from the sample carrier. With the location of the top of the volume being identified, it is possible to precisely identify those parts of the biological material that need to be micromachined to create the lamella. The contrast enhancing step as disclosed herein enables an edge of the biological material, such as the top, to be identified more easily and more accurately, which allows the lamella creation to be more accurate and more easy as well.

Thus, the method allows the step of identifying, using the increased visual contrast, a location within the biological material in the region of interest from which a lamella can be created. Then, the sample can be micromachined to produce said lamella.

The method as disclosed herein is (at least partly) performed at cryogenic temperatures. The biological sample on the sample carrier may be previously prepared by a vitrification process.

Thus the method allows for a rapid, easy and precise way of locating a potential lamella on a biological sample and preparing the lamella using micromachining. With this, the object as defined herein is achieved.

Advantageous embodiments will be discussed below.

In an embodiment, the method comprises the step of using a micromachining tool in at least one of said micromachining steps.

In an embodiment, the method comprises the step of using a charged particle microscope for imaging the sample during at least one or more of the performed steps.

In an embodiment, the method comprises the step of identifying, by a processing unit, a separation edge between the region of interest and the surrounding.

In an embodiment, said step of identifying is performed on an image obtained by the charged particle microscope.

In an embodiment, the method comprises the step of changing the orientation of the sample carrier from one micromachining step to the next.

In an embodiment, the method comprises the step of providing a beam, in particular a focused ion beam (FIB), for at least one of the micromachining steps.

In an embodiment, the method comprises the step of positioning said beam at an angle with respect to a plane defined by said sample carrier in said step of producing said lamella.

In an embodiment, the method comprises the step of positioning said beam substantially orthogonal to a plane defined by said sample carrier in said step of removing material in the sample area and partly surrounding the region of interest.

In an embodiment, the method comprises the steps of:

Providing a beam, in particular a focused ion beam (FIB);

Locating, using charged particle microscopy, said sample area;

Positioning said sample carrier substantially orthogonal relative to the beam and micromachining, using said beam, at least part of the biological sample so as to remove material in the sample area and partly surrounding the region of interest, in order to increase a visual contrast between the biological material in the region of interest and its surroundings;

Changing the relative position of the sample carrier with respect to the beam;

Identifying, using charged particle microscopy and said increased visual contrast, said location within the biological material in the region of interest from which a lamella can be created; and Micromachining, using said beam, the sample to produce said lamella.

In an embodiment, the method comprises the step of obtaining an image of said region of interest and identifying, by a processing unit, said location.

In an embodiment, the method comprises the step of identifying, using said processing unit, a separation edge between the region of interest and the surrounding.

The method may comprise the step of evaluating ice particle contamination on the sample surface and selecting the lamella based on the ice particle contamination. In particular, the lamella site is chosen to minimize or reduce the ice contamination on the lamella.

The method may comprise the step of selecting a milling angle based on ROI positions. The ROI positions may be obtained from fluorescent microscopy techniques. The ROI positions may be used to automatically calculate the most optimal milling angle for creating the lamella. This may include moving the stage and/or the beam for obtaining the optimal milling angle.

According to an aspect, a charged particle beam system is provided with which the method as disclosed herein can be performed. The charged particle beam system as discloses herein comprises:

A sample holder, for holding a biological sample on a sample carrier;

An ion beam column, for producing a focused ion beam (FIB) that propagates along an ion axis onto said biological sample for creating a lamella in said sample;

A charged particle beam column, for producing a charged particle beam that propagates along a charged particle beam axis onto said biological sample;

A detector, for detecting radiation emanating from said biological sample in response to irradiation by said ion beam and/or said charged particle beam;

A processing unit, for at least partially controlling operation of said microscope.

The charged particle beam system as defined herein is arranged for Identifying, by said processing unit, a location within the biological material in the region of interest from which a lamella can be created. The increased visual contrast may enable the processing unit to process, for example, an image containing the region of interest. The processing unit may then identify the contours of the biological material, with which the location of the potential lamella can be set.

The processing unit may be arranged for setting of the location of the potential lamella. With this, no user interaction is required, and the lamella identification can be done automatically.

In an embodiment, the processing unit is arranged for controlling said focused ion beam for micromachining the sample for producing said lamella, wherein use is made of the location of said lamella as identified by said processing unit. This allows a semi-automatic lamella creation process to be performed, requiring minimal user-interaction.

Figures 3A, 3B:
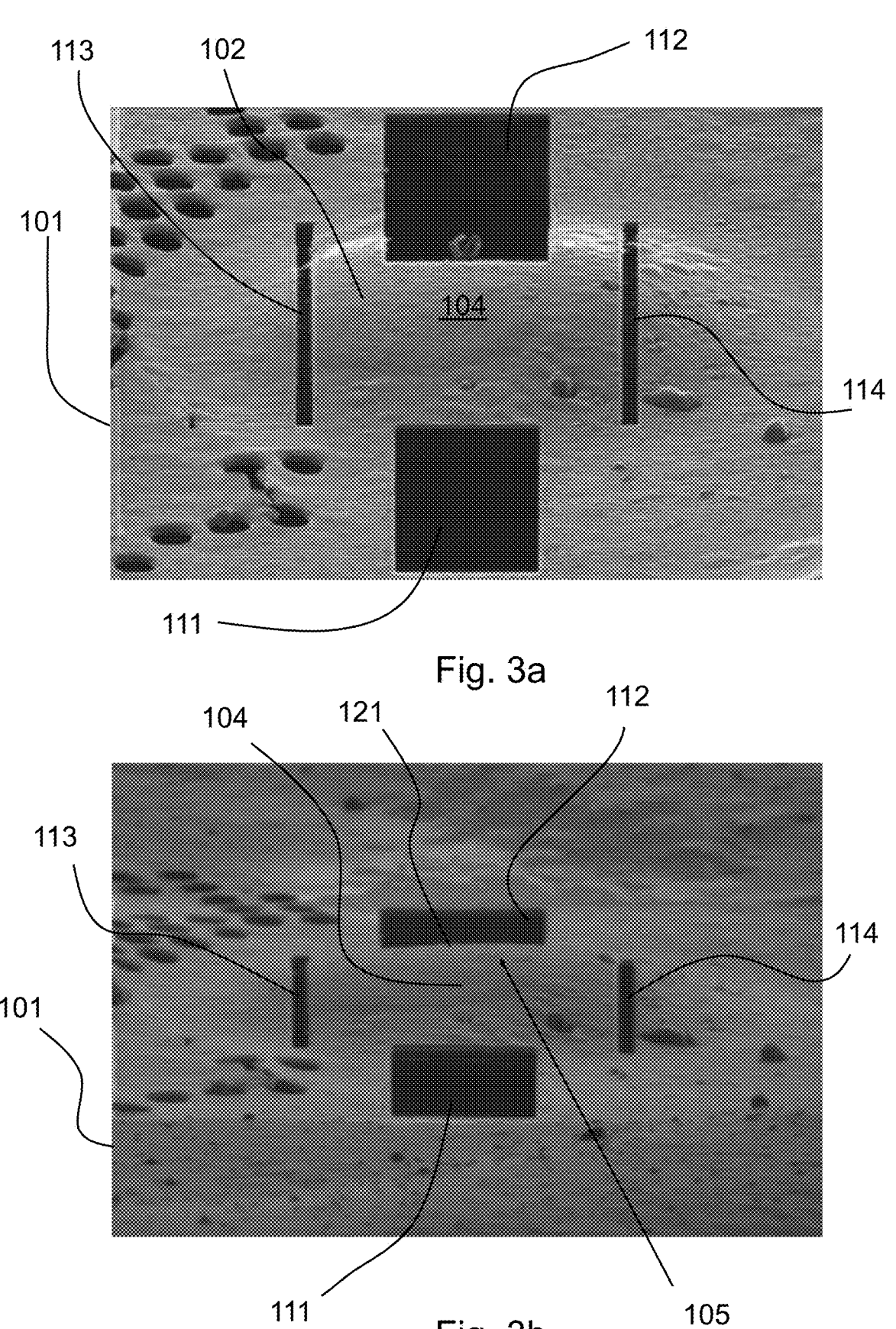
Figure 3C:
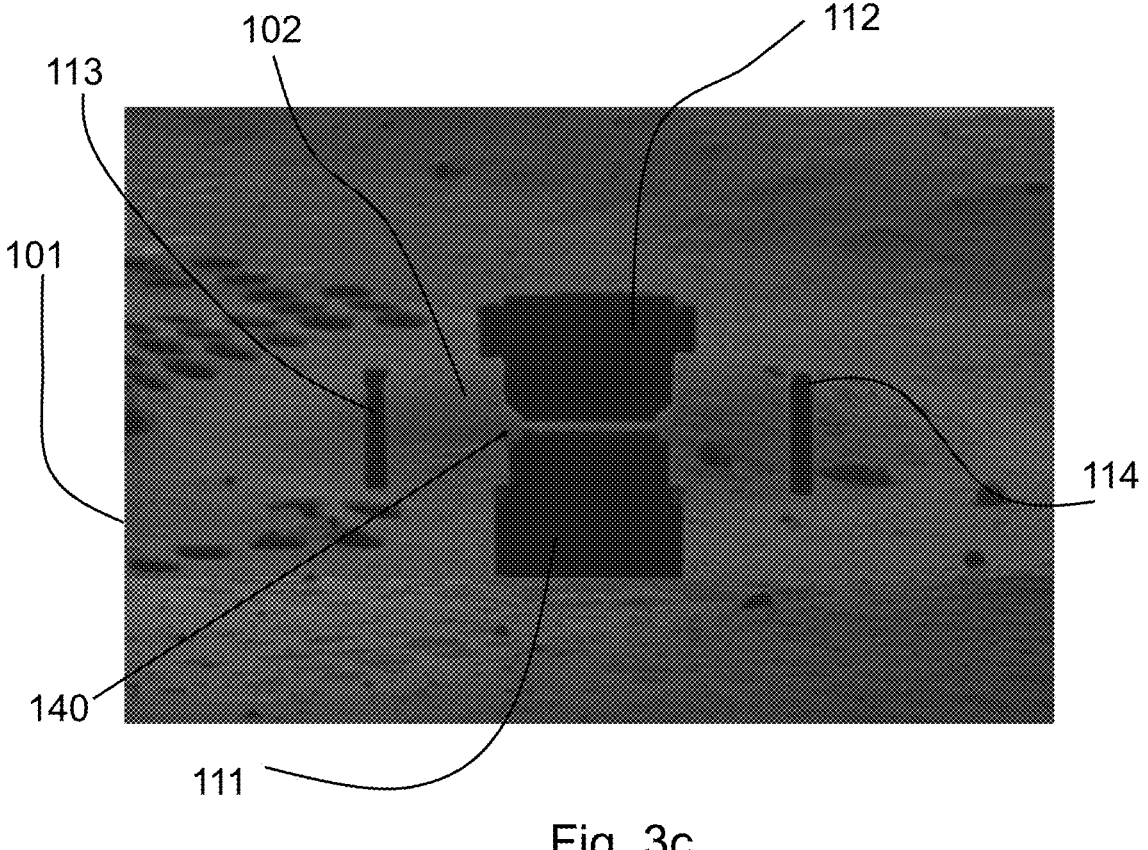
Figures 4, 5:
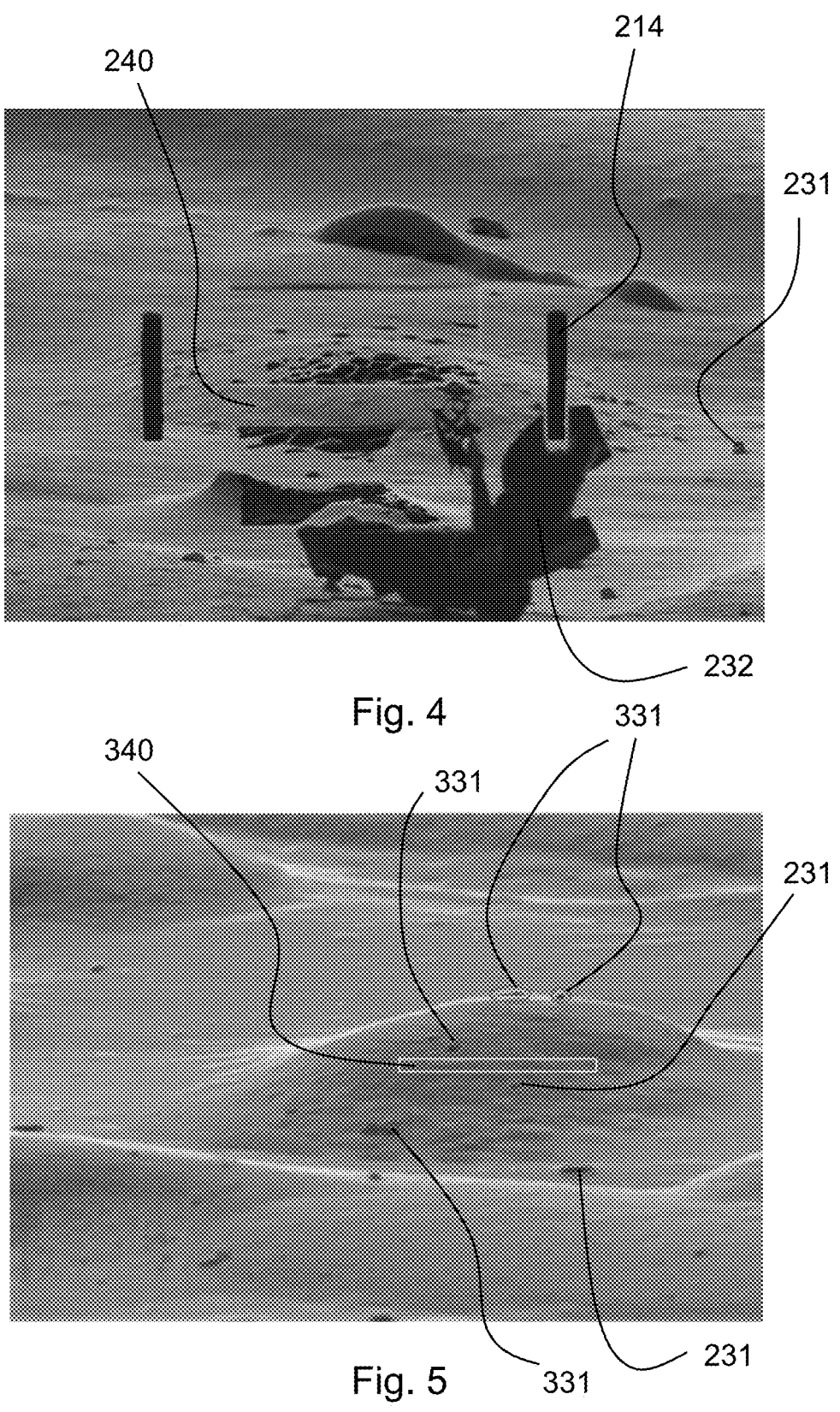
Figures 6A, 6B, 6C:
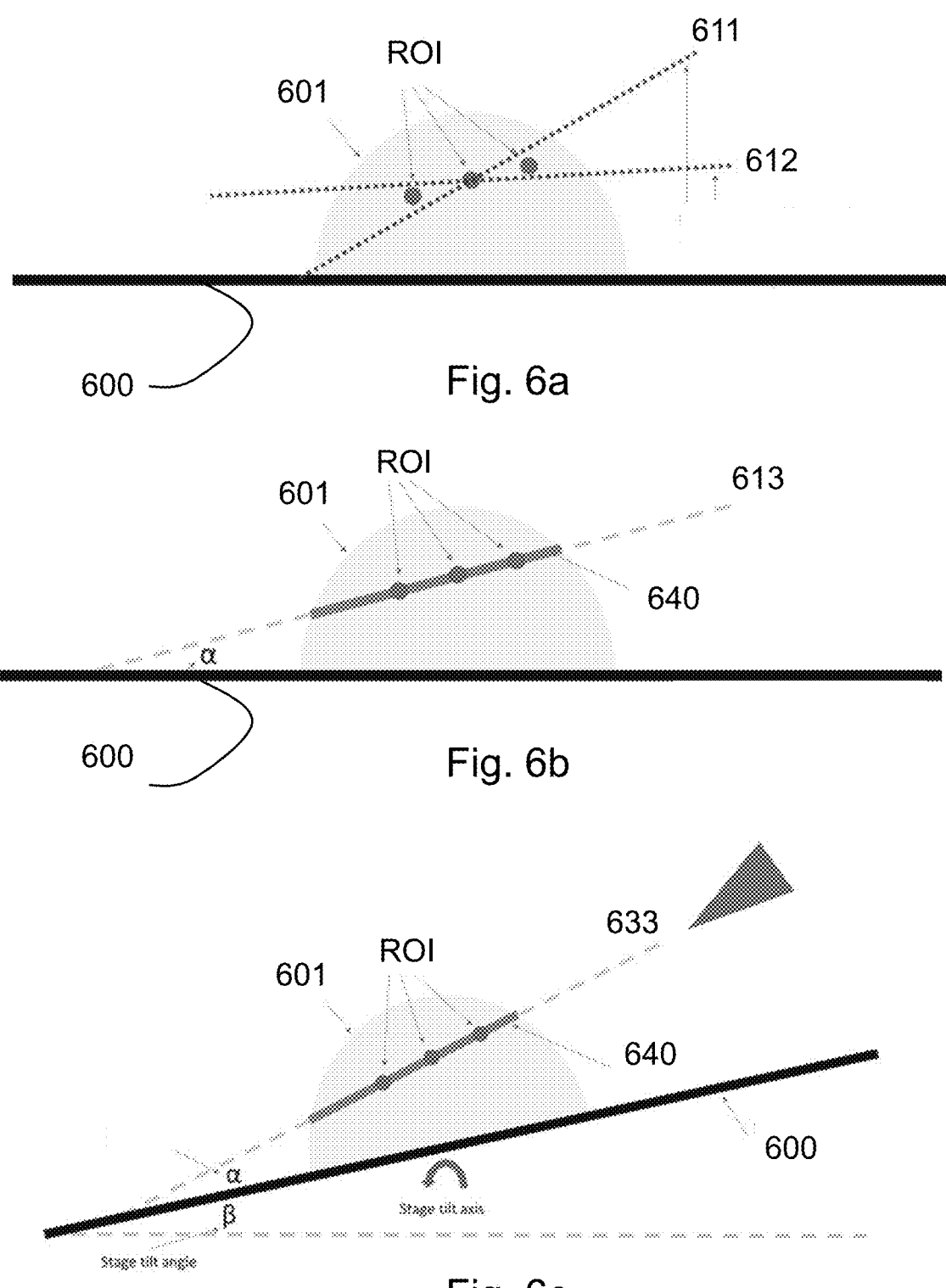

The method and apparatus of the disclosure will now be elucidated in more detail on the basis of exemplary embodiments and the accompanying schematic drawings, in which:

FIG. 1—renders a longitudinal cross-sectional elevation view of an embodiment of a dual-beam charged particle beam system;

FIG. 2a-2f—show a milling procedure on a sample according to an embodiment;

FIG. 3a-c—show electron microscope images of a milling procedure on a sample according to an embodiment;

FIG. 4—shows an embodiment of contamination on a sample;

FIG. 5—shows an embodiment of lamella placement on a sample;

FIG. 6a-6c—shows an embodiment of lamella angle placement.

FIG. 1 shows a highly schematic depiction of an embodiment of a charged particle beam system. Here, a dual-beam charged particle microscope (CPM) is shown; more specifically, it shows an embodiment of a FIB-SEM. The microscope M comprises a particle-optical column 1, which produces a beam 3 of charged particles (in this case, an electron beam) that propagates along a particle-optical axis 3'. The column 1 is mounted on a vacuum chamber 5, which comprises a sample holder 7 and associated actuator(s) 7' for holding/positioning a sample 6. The vacuum chamber 5 is evacuated using vacuum pumps (not depicted). With the aid of voltage supply 17 the sample holder 7, or at least the sample 6, may, if desired, be biased (floated) to an electrical potential with respect to ground. Also depicted is a vacuum port 5', which may be opened so as to introduce/remove items (components, samples) to/from the interior of vacuum chamber 5. A microscope M may comprise a plurality of such ports 5', if desired.

The column 1 (in the present case) comprises an electron source 9 (such as a Schottky gun, for example) and an illuminator 2. This illuminator 2 comprises (inter alia) lenses 11, 13 to focus the electron beam 3 onto the sample 6, and a deflection unit 15 (to perform beam steering/scanning of the beam 3). The microscope M further comprises a processing unit 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the sample 6 in response to irradiation by the (impinging) beam 3. In the apparatus depicted here, the following (non-limiting) detector choices have been made:

Detector 19 is a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example;

Detector 21 is an electron detector in the form of a Solid State Photomultiplier (SSPM) or evacuated Photomultiplier Tube (PMT) [e.g. Everhart-Thornley detector], for example. This can be used to detect backscattered and/or secondary electrons emanating from the sample 6.

The skilled artisan will understand that many different types of detector can be chosen in a set-up such as that depicted, including, for example, an annular/segmented detector.

By scanning the beam 3 over the sample 6, stimulated radiation comprising, for example, X-rays, infrared/visible/ultraviolet light, secondary electrons (SEs) and/or backscattered electrons (BSEs) —emanates from the sample 6. Since such stimulated radiation is position-sensitive (due to said scanning motion), the information obtained from the detectors 19, 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19, 21 pass along control lines (buses) 25'; are processed by the processing unit 25; and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

In addition to the electron column 1 described above, the microscope M also comprises an ion-optical column 31. This comprises an ion source 39 and an illuminator 32, and these produce/direct an ion beam 33 along an ion-optical axis 33'. To facilitate easy access to sample 6 on holder 7, the ion axis 33' is canted relative to the electron axis 3'. As hereabove described, such an ion (FIB) column 31 can, for example, be used to perform processing/machining operations on the sample 6, such as incising, milling, etching, depositing, etc. Alternatively, the ion column 31 can be used to produce imagery of the sample 6. It should be noted that ion column 31 may be capable of generating various different species of ion at will, e.g. if ion source 39 is embodied as a so-called NAIS source; accordingly, references to ion beam 33 should not necessarily been seen as specifying a particular species in that beam at any given time—in other words, the beam 33 might comprise ion species A for operation A (such as milling) and ion species B for operation B (such as implanting), where species A and B can be selected from a variety of possible options.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 43', and can be administered through a narrow nozzle 43", so as to emerge in the vicinity of the intersection of axes 3' and 33', for example.

The charged particle beam system is arranged for working with the biological sample at cryogenic temperatures.

It should be noted that many refinements and alternatives of such a set-up will be known to the skilled artisan, such as the use of a controlled environment within (a relatively large volume of) the microscope M, e.g. maintaining a background pressure of several mbar (as used in an Environmental SEM or low-pressure SEM).

In any event, the Charged Particle Beam system as disclosed in FIG. 1 comprises:

A sample holder 7, for holding a biological sample that is provided on a sample carrier 6;

An ion beam column 31, for producing a focused ion beam (FIB) that propagates along an ion axis 33' onto said biological sample for creating a lamella in said sample;

A charged particle beam column 1, for producing a charged particle beam that propagates along a charged particle beam axis 3' onto said biological sample;

A detector 21, for detecting radiation emanating from said biological sample in response to irradiation by said ion beam and/or said charged particle beam;

A processing unit 25, for at least partially controlling operation of said microscope.

As will be described in more detail below, the processing unit 25 is arranged for Identifying, using the increased visual contrast obtained by micromachining the sample, a location within the biological material in the region of interest from which a lamella can be created.

FIG. 2a-2f schematically show an embodiment of the method as disclosed herein. The embodiment, and variants thereof, will next be described. In the steps shown, a charged particle microscope (such as an electron microscope) can be used for imaging the sample during at least one or more of the performed steps. In the embodiments shown, the figures schematically represent such images that can be obtained by the microscope.

Figure 2A:
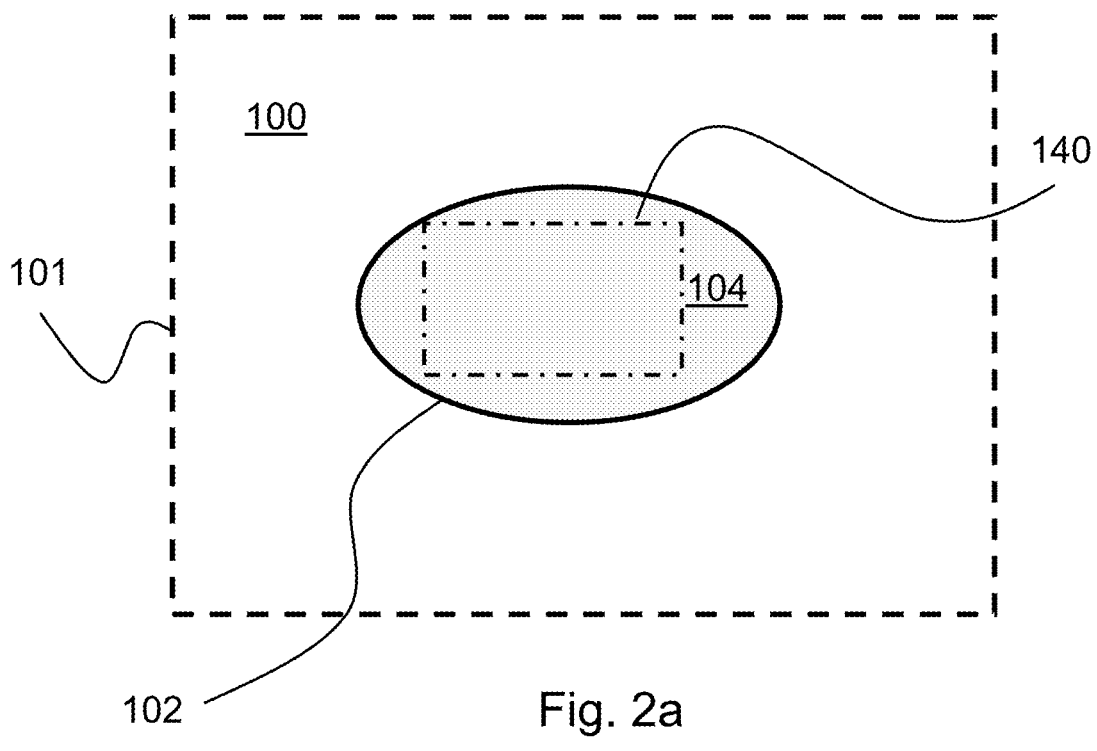

FIG. 2a shows a top view of a relatively small part of the sample carrier 100 (known to those skilled in the art), having biological material 104 provided on top thereof. The biological material 104 comprises a biological cell, for example, from which a potential lamella 140 (indicated with dashed lines here) can be extracted.

Thus, FIG. 2a shows a sample area 101 of the sample carrier 100, and that comprises a region of interest 102 (the biological cell) from which a lamella 140 can be created. This sample area 101 can be located, by a user, for example visually, by using the electron microscope. FIG. 2a thus represents a schematic overview of an image that can be seen by the user when using the microscope, and being in fact a top-down view onto the sample carrier 100. Once the user identifies the potential lamella 140 in the sample area 101, the next step may be performed. It is noted that the region of interest as shown in FIG. 2a coincides with the biological material, and is highly defined. In practice, however, the distinguishing between the region of interest and the biological material may be less clear, see FIG. 3a for example.

Figure 2B:
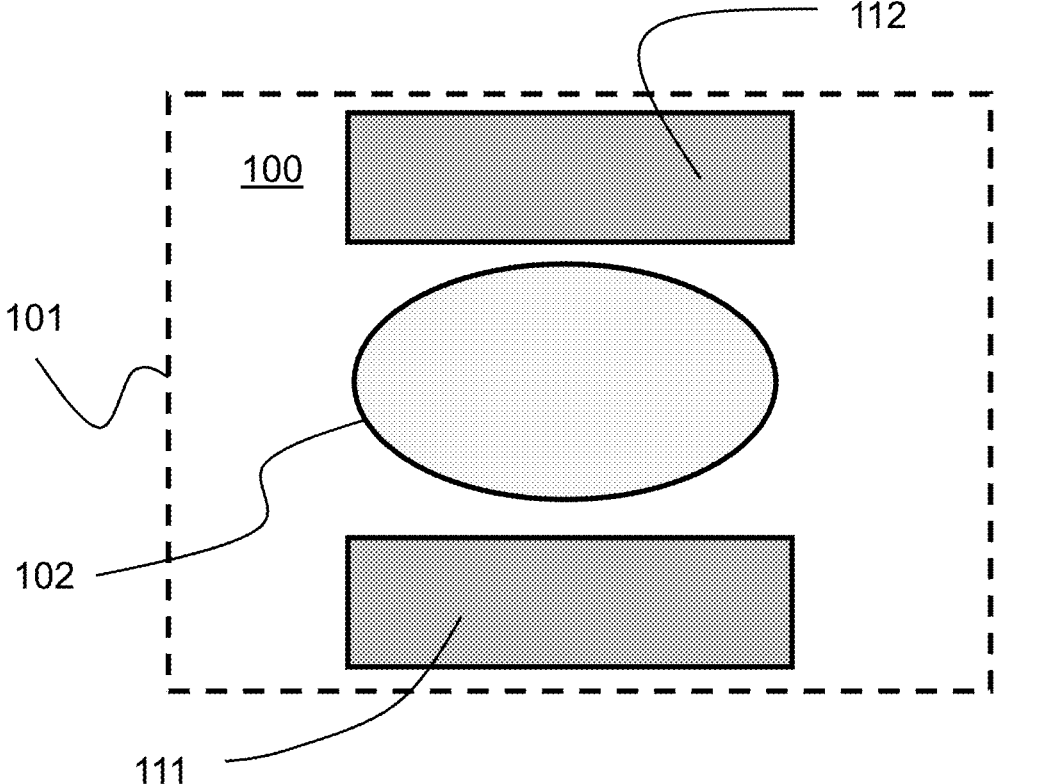
Figure 2C:
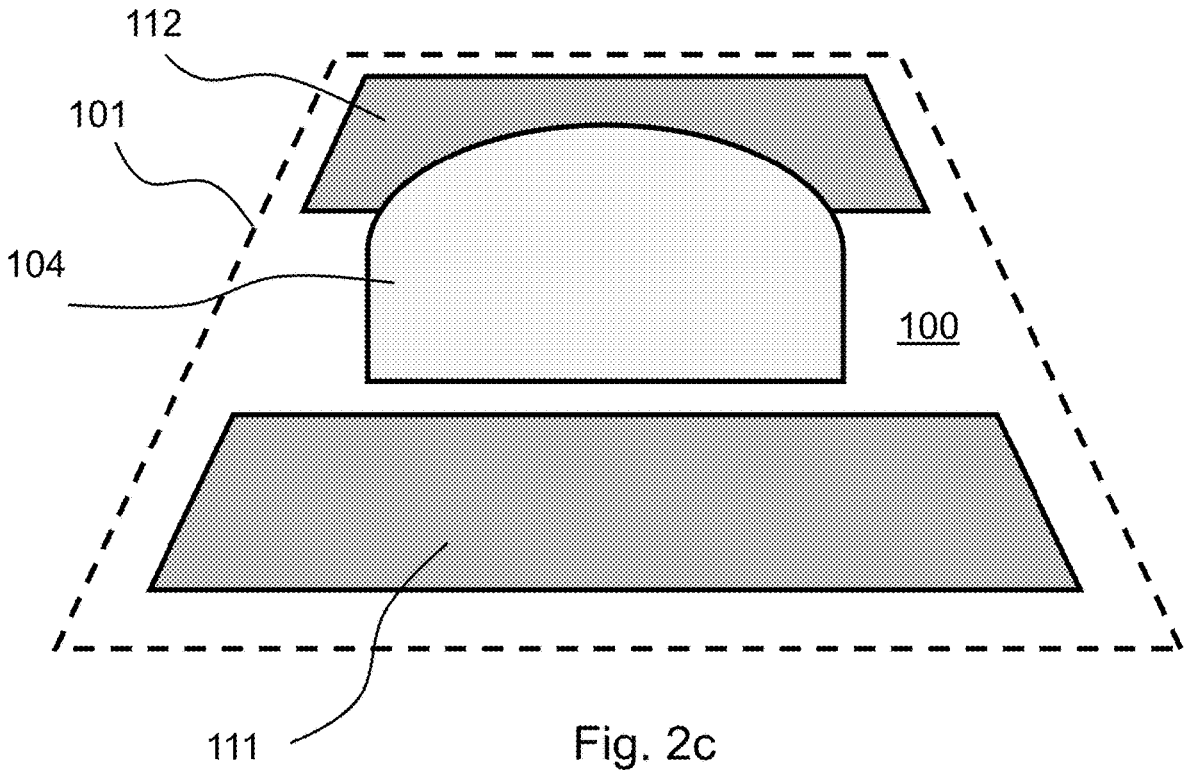

FIG. 2b shows a step in the method as disclosed herein that comprises micromachining a part of the sample carrier 100 so that material in a part of the sample area 101 surrounding the region of interest 102 is removed. The focused ion beam may be used in this step. The sample carrier 100 may be positioned such that the plane defined by the sample carrier 100 is positioned substantially orthogonal (or at least near orthogonal, for example at an angle ranging in between 75-90 degrees) with respect to the ion beam axis 33'. In other embodiments, an angle of about 50 degrees can be used, in case the hardware used limits the use of larger milling angles. The focused ion beam is used to remove a front part 111 and a rear part 112. By removing the material in front of, and in the rear of, the region of interest 102, the visual contrast between the biological material in the region of interest and its surroundings is increased. This can be seen in FIG. 2c, which provides a perspective view of the situation obtained in FIG. 2b. It can be seen that the edges of the cell 102 are clearly visible, in particular by removal of the rear part 112.

Figure 2D:
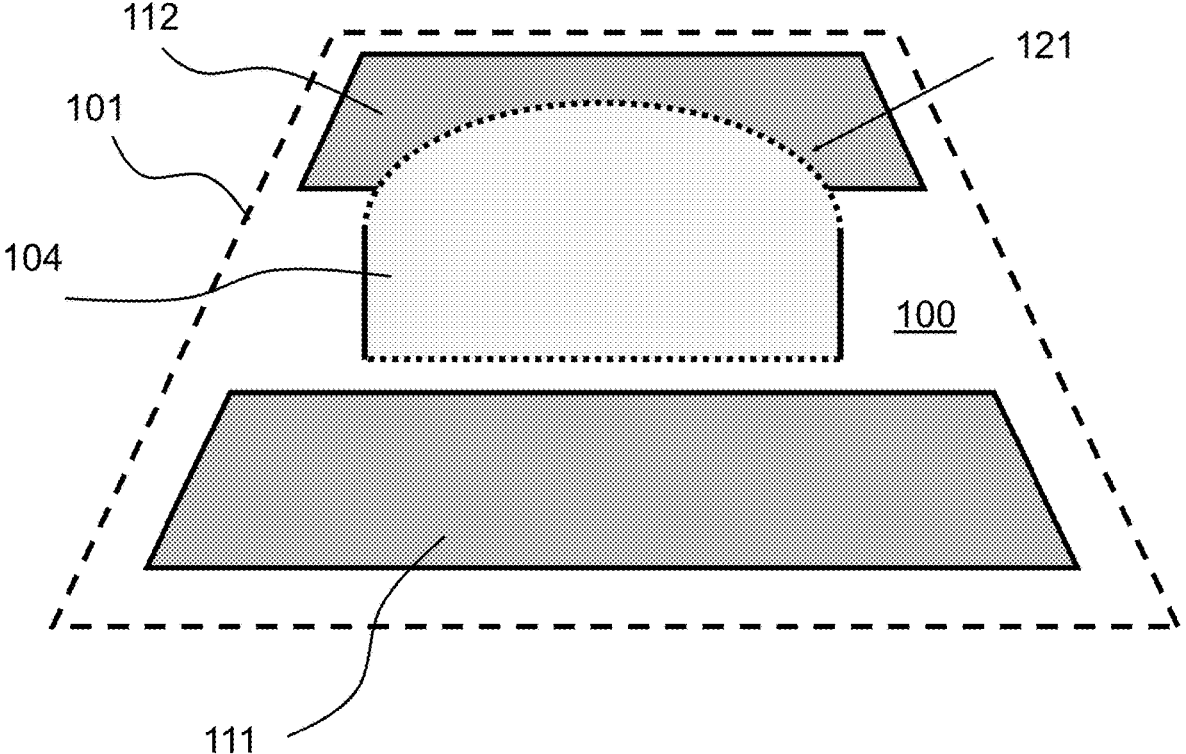

FIG. 2d shows the (optional) step of identifying boundaries 121 of the biological material 104 from which the lamella can be made. The boundary 121 acts like a separating edge 121 between the region of interest 102 and the sample area 101. This identification of this boundary is beneficial for determining the exact location from where to excavate the lamella. The increased contrast is beneficial in performing this step. This step can be performed manually by a user, but can also be performed by the processing unit (i.e. automatically).

Figure 2E:
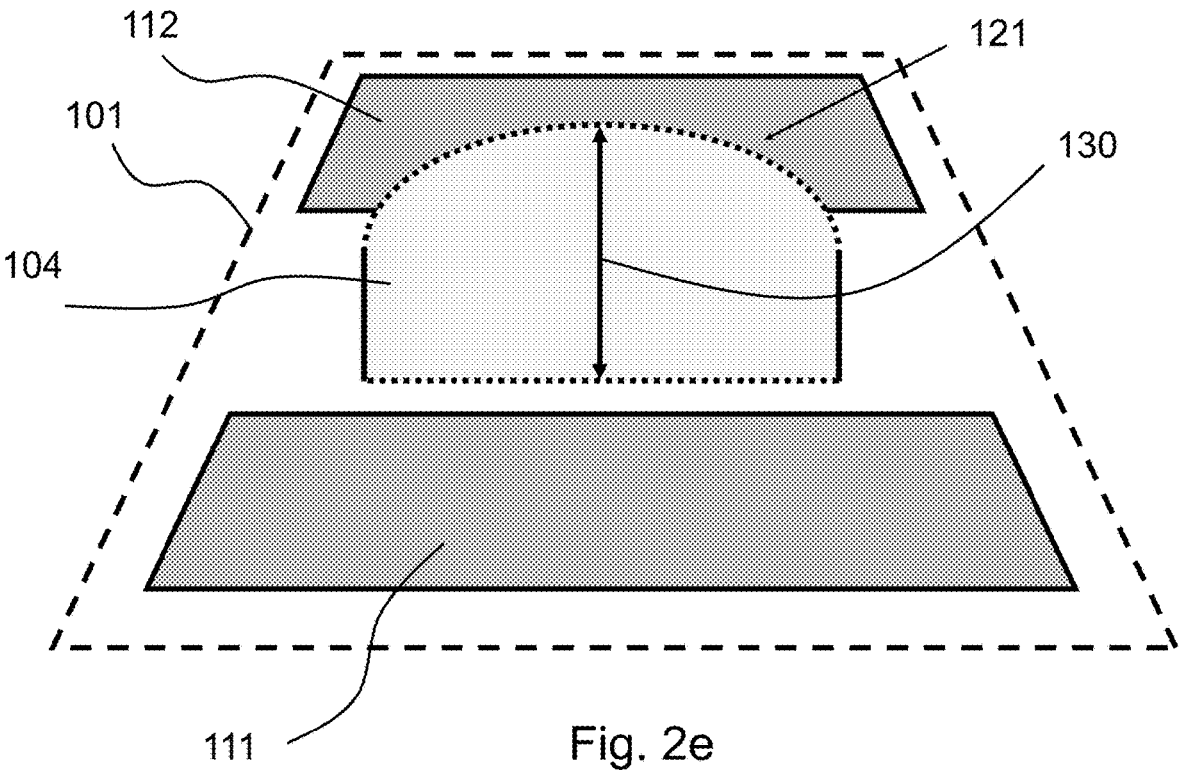

FIG. 2e shows that the height 130 of the cell 104 can be measured, using several parameters such as the location, the viewing angle, the detected edges of the cell, etcetera. This step can be performed manually by a user, e.g. by using a graphical user interface to enter the height on screen, after which the processing unit can determine the actual height based on the user's input. Alternatively this step can be performed by the processing unit (i.e. automatically).

Figure 2F:
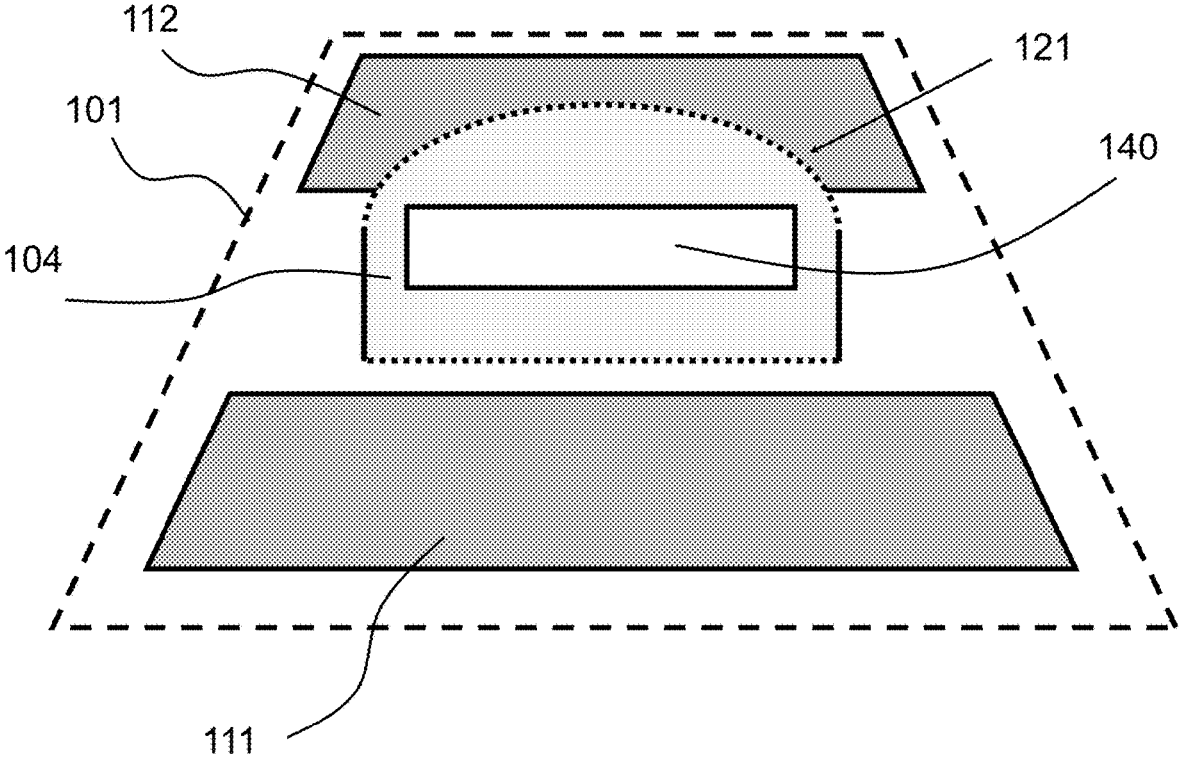

FIG. 2f shows the lamella 140 placement, i.e. the identification of the position of the desired lamella 140 within the biological material 104. Once identified, micromachining may be used, for example using the FIB, for micromachining the sample to produce said lamella. Here, the beam will be positioned at a non-orthogonal angle with respect to a plane defined by said sample carrier. For this the so-called milling angle may be used, which milling angle may be about 10-20 degrees, as is known to those skilled in the art.

It can be seen that the micromachining performed in FIG. 2b is done at a different angle compared to the micromachining that is performed in FIG. 2f. This can be done by changing the orientation of the sample carrier with respect to the focused ion beam from one micromachining step to the next.

From the above it follows that the increased visual contrast aids in identifying a lamella location.

Summarized, FIG. 2a-2f show a method as disclosed herein, that comprises the steps of:

Providing a beam, in particular a focused ion beam (FIB);

Locating, using charged particle microscopy, said sample area 101;

Positioning said sample carrier 100 substantially orthogonal relative to the beam and micromachining, using said beam, at least part of the biological sample so as to remove material in the sample area 100 and partly surrounding the region of interest 102, in order to increase a visual contrast between the biological material 104 in the region of interest and its surroundings 100;

Changing the relative position of the sample carrier 100 with respect to the beam;

Identifying, using charged particle microscopy and said increased visual contrast, said location within the biological material in the region of interest from which a lamella 140 can be created; and Micromachining, using said beam, the sample to produce said lamella 140.

FIGS. 3a to 3c show microscopic images of parts of the method as disclosed herein. Here, FIG. 3a shows the sample in near-orthogonal, or substantially orthogonal view, showing the front part 111 (front pattern 111) and rear part 112. It can be seen that the region of interest 102, in practice, is not so well defined, and gradually runs over into the sample area 102 (i.e. the surroundings of the region of interest). Thus, it can be expected that the rear part 112 as seen here actually infringes a bit of the region of interest 102. This is still ok, as the larger part of the biological material 104 remains intact and the lamella 140 can be excavated. FIG. 3a also shows left and right side trenches 113, 114. These trenches are commonly used for material stress reduction, but they can also be used as a reference or alignment pattern, since the contrast difference there is also apparent.

FIG. 3b shows a slanted view of the situation of FIG. 3a, from which it can be seen that the rear part 112 creates an increased visual contrast between the cell 104 and the surroundings. With this the top 105 of the cell is clearly visible.

FIG. 3c shows the further micromachining of the biological material 104 for creating the lamella 140.

FIG. 4 shows a cryo-EM sample with a potential lamella 240. Here it can be seen that the sample has several contaminations 231, 232 thereon. Contamination with various ice particles distributed on the sample surface make cryo-lamella preparation for cryo-electron tomography prone to disrupt the lamella 240 quality. So far, it seems, that sample preparation or sample handling will always lead to some amount of non-homogenous contamination.

We can classify the non-homogenous contamination into two parts:

1) Speckle contamination—substantial number of very small ice particles 231 distributed on the whole sample surface. When milling over the speckle contamination, the final lamella will have curtaining effect, which renders it unfit for tomography.

2) Large ice contamination—small number of very large ice particles 232 somewhere on the sample surface. When milling around the large ice contamination—the beam is affected by the charge of ice particle and thus the milling is affected in an unpredictable way (which can be seen a bit in the right trench 214).

In the regular automated milling process, before any pattern placement, a drift correction algorithm can be used to correct the drift associated with various sources. In an alternative embodiment, machine learning and image processing techniques can be used to utilize the already acquired drift correction image. The drift correction image can be segmented using convolutional neural networks, or heuristically via low contrast always present in the ice particles 231, 232.

Segmentation can be used to address the problem caused by the contamination present in the image by:

1) Prompting the user to reposition the pattern to another location (in case of speckle contamination 231)

2) Automatic reposition of the pattern to another location (in case of speckle contamination 231)

3) Removal of the lamella 240 milling site from the workflow to save time (in case of large ice contamination 232)

4) Try to automatically remove the ice (in case of large ice contamination 232, there are procedures able to remove ice contamination) The procedure allows the monitoring of non-homogenous contamination during each DCM rescan interval.

An example of automatic pattern placement is shown in FIG. 5, where ice contamination (small speckles 331) surrounds a potential lamella site 340. The above procedure to address the problem caused by contamination can be used, for example by automatically selecting the lamella site 340 (indicated by the grey box).

Turning to FIGS. 6a and 6b, an embodiment is shown that optimizes the desired regions of interest (ROI) in cryo-EM lamella preparation. It is desirable to have a lamella 640 that contains as many of the desired ROIs inside the polished lamella as possible (see FIG. 6b). The angle between the ion beam 611, 612, 613 and sample plane 600 used for the lamella milling is called the milling angle (various angles are achieved by changing the stage tilt). Often, one aims at the lowest possible milling angle (as close to perpendicular to sample surface 600) as possible to allow the largest surface area of the lamella 640. This is a valid strategy for the blind (brute force) lamella milling procedure—with larger lamella the chances of containing desired ROI are bigger. However, with the knowledge of the positions of ROIs (e.g. from fluorescent microscope) such an approach is sub-optimal.

FIGS. 6a and 6b show how an automatic method can be used for the definition of the optimal lamella milling angle, wherein use is made of the identified ROIs in the cell 601. Results of the targeting are 3D positions of the targeted structures (ROIs) inside the sample volume 601.

The location of the ROIs in the cell 601 can be used to calculate feasible milling angles 611, 612, 613. Here use can be made of hardware-defined limits, conditions of achievable lamella milling, and the known 3D positions of ROIs. These ROIs can be obtained from identification techniques, such as fluorescent microscopy. The best possible outcome, i.e. the most of the ROIs present in the lamella 640 (see FIG. 6b), can be calculated before the milling procedure starts. The method can also utilize the volume information of the targeted ROIs (in case of larger ROIs compared to the lamella thickness). This method allows less lamellae to be needed for experiments, which significantly reduce tool time and resources of the user.

As indicated in FIG. 6c, the method may include a rotation/tilt β of the sample plane 600, to allow a relatively low milling angle α to be used. By tilting the stage about angle β about the stage tilt axis, the ion beam 633 can be aimed to produced the desired lamella 640.

The desired protection is determined by the appended claims.

The invention claimed is:

1. A method for micromachining a biological sample for creating a lamella for analysis in a Cryo-Charged Particle Microscope (Cryo-CPM), the method comprising:

providing a biological sample on a sample carrier;

locating a sample area on the sample carrier, said sample area surrounding a region of interest having biological material from which a lamella can be created;

micromachining at least part of the sample carrier so as to remove material in a part of the sample area adjacent to the region of interest, in order to increase a visual contrast between the biological material in the region of interest and a portion of the sample area surrounding the biological material;

identifying, by a processing unit using the increased visual contrast between the biological material in the region of interest and its surroundings, a location within the biological material in the region of interest from which a lamella can be created; and micromachining the sample to produce said lamella from the identified location within the biological material.

2. The method according to claim 1, further comprising using a micromachining tool in at least one of micromachining at least part of the sample carrier and micromachining the sample to produce said lamella.

3. The method according to claim 1, further comprising imaging the sample using a charged particle microscope.

4. The method according to claim 3, wherein identifying the location within the biological material in the region of interest from which the lamella can be created is performed on an image obtained by the charged particle microscope.

5. The method according to claim 1, wherein identifying the location within the biological material in the region of interest includes identifying, by the processing unit, a separation edge between the region of interest and the portion of the sample area surrounding the biological material.

6. The method according to claim 1, further comprising changing the orientation of the sample carrier after micromachining the at least part of the sample carrier.

7. The method according to claim 1, further comprising providing a focused ion beam (FIB) for at least one of micromachining at least part of the sample carrier and micromachining the sample to produce said lamella.

8. The method according to claim 7, wherein micromachining the sample to produce said lamella includes positioning said beam at an angle with respect to a plane defined by said sample carrier.

9. The method according to claim 7, wherein micromachining at least part of the sample carrier includes positioning said beam substantially orthogonal to a plane defined by said sample carrier.

10. The method according to claim 1, further comprising:
providing a focused ion beam (FIB);
positioning said sample carrier substantially orthogonal relative to the beam prior to micromachining at least part of the sample carrier; and changing, after micromachining the at least part of the sample carrier, the position of the sample carrier with respect to the beam prior to micromachining the sample to produce said lamella.

11. The method according to claim 10, further comprising obtaining, using charged particle microscopy, an image of said region of interest and identifying, by the processing unit, said location.

12. The method according to claim 11, wherein identifying the location within the biological material in the region of interest includes identifying, using said processing unit, a separation edge between the region of interest and the portion of the sample area surrounding the biological material.

13. The method according to claim 1, wherein ice particle contamination on the sample area is evaluated and accounted for in selecting the lamella.

14. The method according to claim 1, further comprising calculating a milling angle based on the identified location within the biological material in the region of interest from which the lamella can be created.

15. The method according to claim 1, wherein identifying the location within the biological material in the region of interest from which the lamella can be created includes measuring a height of the biological material in the region of interest.

16. The method according to claim 1, wherein micromachining the at least part of the sample carrier so as to remove material in the part of the sample area surrounding the region of interest includes removing material of the sample area in front of, in a rear of, to a right of, and to a left of the biological material.

* * * * *